US012777673B2

(12) United States Patent
Jin et al.

(10) Patent No.: US 12,777,673 B2
(45) Date of Patent: Oct. 27, 2026

(54) SEMICONDUCTOR DEVICE AND PREPARATION METHOD THEREFOR

(71) Applicant: CSMC TECHNOLOGIES FAB2 CO., LTD., Wuxi (CN)

(72) Inventors: Huajun Jin, Wuxi (CN); Liang Song, Wuxi (CN); Yongshun Li, Wuxi (CN); Mei Yuan, Wuxi (CN); Yanan Wang, Wuxi (CN); Lin Luo, Wuxi (CN); Qiang Zhang, Wuxi (CN)

(73) Assignee: CSMC TECHNOLOGIES FAB2 CO., LTD., Wuxi (CN)

( * ) Notice: Subject to any disclaimer, the term of this patent is extended or adjusted under 35 U.S.C. 154(b) by 341 days.

(21) Appl. No.: 18/576,942

(22) PCT Filed: Dec. 14, 2022

(86) PCT No.: PCT/CN2022/139067

§ 371 (c)(1),
(2) Date: Jan. 5, 2024

(87) PCT Pub. No.: WO2023/125013

PCT Pub. Date: Jul. 6, 2023

(65) Prior Publication Data

US 2024/0304720 A1 Sep. 12, 2024

(30) Foreign Application Priority Data

Dec. 31, 2021 (CN) ......................... 202111674077.3

(51) Int. Cl.
*H01L 29/78* (2006.01)
*H10D 30/01* (2025.01)
(Continued)

(52) U.S. Cl.
CPC ......... *H10D 30/65* (2025.01); *H10D 30/0281* (2025.01); *H10D 62/10* (2025.01)

(58) Field of Classification Search
CPC .... H10D 30/65; H10D 30/0281; H10D 62/10; H10D 62/151
See application file for complete search history.

(56) References Cited

U.S. PATENT DOCUMENTS

| | | | | |
|---|---|---|---|---|
| 9,620,638 | B1 | 4/2017 | Luo et al. | |
| 10,978,587 | B2 * | 4/2021 | Ryu | H10D 30/603 |

(Continued)

FOREIGN PATENT DOCUMENTS

| | | | |
|---|---|---|---|
| CN | 102623345 | A | 8/2012 |
| CN | 103441147 | A | 12/2013 |

(Continued)

OTHER PUBLICATIONS

ISA State Intellectual Property Office of the People's Republic of China, International Search Report Issued in Application No. PCT/CN2022/139067, Mar. 4, 2023, WIPO, 3 pages.

(Continued)

*Primary Examiner* — Thao P Le

(74) *Attorney, Agent, or Firm* — Christopher R. Carroll; Carroll, Hoette & Butscher, LLC

(57) ABSTRACT

The present disclosure involves a semiconductor device and a manufacturing method thereof. A second well region is inserted between first well regions of a semiconductor device to improve the breakdown voltage of the device, and at the same time, the dimension of the upper surface of the second well region in the width direction of the device's conductive channel is set to be smaller than the dimension of the lower surface of the second well region in the width direction of the device's conductive channel to increase the dimension of the upper surface of the adjacent first well region in the width direction of the device's conductive channel. That is, the path width of the current flowing through the upper surface of the drift region is increased (Continued)

when the device is on, and thus the device's on-resistance is reduced.

15 Claims, 6 Drawing Sheets

(51) Int. Cl.
*H10D 30/65* (2025.01)
*H10D 62/10* (2025.01)

(56) References Cited

U.S. PATENT DOCUMENTS

| | | | | |
|---|---|---|---|---|
| 11,031,497 B2 * | 6/2021 | Wang | H10D 30/0221 | |
| 11,217,691 B2 * | 1/2022 | Ningaraju | H10D 30/0221 | |
| 11,894,457 B2 * | 2/2024 | Ge | H10D 30/0289 | |
| 2010/0032754 A1 | 2/2010 | Kawaguchi | | |
| 2015/0129959 A1 * | 5/2015 | Ji | H02M 1/4258 | 438/286 |
| 2016/0087039 A1 * | 3/2016 | Ko | H10D 30/0281 | 438/286 |
| 2022/0302305 A1 | 9/2022 | He | | |
| 2023/0126337 A1 * | 4/2023 | Kim | H02M 1/08 | 257/438 |

FOREIGN PATENT DOCUMENTS

| | | |
|---|---|---|
| CN | 106024897 A | 10/2016 |
| CN | 111969043 A | 11/2020 |
| CN | 112530805 A | 3/2021 |
| WO | 2021051853 A1 | 3/2021 |

OTHER PUBLICATIONS

ISA State Intellectual Property Office of the People's Republic of China, Written Opinion of the International Searching Authority Issued in Application No. PCT/CN2022/139067, Mar. 4, 2023, WIPO, 4 pages. (Submitted with Machine/ Partial Translation).

European Patent Office, Extended European Search Report Issued in Application No. 22914268.2, Jul. 9, 2025, Germany, 10 pages.

* cited by examiner

SEMICONDUCTOR DEVICE AND PREPARATION METHOD THEREFOR

CROSS REFERENCE TO RELATED APPLICATIONS

This application is a US National Phase of a PCT Application No. PCT/CN2022/139067 filed on Dec. 14, 2022, which claims priority to Chinese Patent Application No. 2021116740773 filed on Dec. 31, 2021, the entire contents of which are incorporated herein by reference in their entireties.

TECHNICAL FIELD

The present disclosure relates to the field of semiconductor technology, in particular to semiconductor devices and manufacturing methods thereof.

BACKGROUND

High-voltage devices have characteristics of high input resistance, low noise, low power consumption and strong flexibility, and are widely used in integrated circuits. For high-voltage devices, key parameters include threshold voltage, on-resistance, saturation current, breakdown voltage, etc, specific On Resistance (referred to as Ron, sp) in a drift region has a contradictory relationship with the breakdown voltage (BV) of the device Ron, sp$\infty$BV$^{\beta}$. How to alleviate the contradiction between the on-resistance and the breakdown voltage, that is, how to effectively improve voltage resistance while reducing on-resistance, has become an urgent problem for the skilled in the art.

SUMMARY

Based on this, it is necessary to provide a semiconductor device with high breakdown voltage and small on-resistance and a manufacturing method thereof.

A semiconductor device is provided, and includes:

a substrate with a first conductive type; and a drift region on an upper surface of the substrate, where the drift region includes at least two first well regions with a second conductivity type and at least one second well region with a first conductivity type that contact each other and are alternately arranged along a width direction of a device's conductive channel, where the first conductivity type and the second conductivity type have opposite conductivity types, and for one of the at least one second well region, a dimension of an upper surface of the second well region in the width direction of device's conductive channel is smaller than a dimension of a lower surface of the second well region in the width direction of device's conductive channel.

In an embodiment, a doping concentration on the upper surface of the second well region is greater than a doping concentration on the lower surface of the second well region.

In an embodiment, upper surfaces of the at least two first well regions, the upper surface of the second well region, and an upper surface of the substrate are coplanar, lower surfaces of the at least two first well regions and the lower surface of the second well region are coplanar, and a thickness of each of the at least two first well regions is equal to a thickness of the second well region.

In an embodiment, the second well region includes a first doped region and a second doped region under the first doped region, and a doping concentration of the first doped region is greater than a doping concentration of the second doped region.

In an embodiment, at least one of interfaces between the at least two first well regions and the second well region is inclined to a plane of the substrate.

In an embodiment, cross-sectional shapes of the at least two first well regions and the second well region along the width direction of the device's conductive channel are trapezoidal. In an embodiment, the semiconductor device further includes:

a source region with the second conductivity type, on the upper surface of the substrate, and separated from the drift region;

a body region surrounding the source region and adjacent to or separated from the drift region;

a body lead-out region with the first conductivity type, on an upper surface of the body region, and adjacent to the source region;

a gate electrode on the upper surface of the substrate and covering the drift region, the body region and the source region; and a drain region on an upper surface of the drift region and separated from the gate electrode.

In an embodiment, a doping concentration in the body region is greater than a doping concentration in the second well region with the first conductivity type.

A manufacturing method for a semiconductor device is provided, and includes:

providing a substrate with a first conductivity type; and forming a drift region on an upper surface of the substrate, where the drift region includes at least two first well regions with a second conductivity type and at least one second well region with a first conductivity type that contact each other and are alternately arranged along a width direction of a device's conductive channel, where the first conductivity type and the second conductivity type have opposite conductivity types, and for one of the at least one second well region, a dimension of an upper surface of the second well region in the width direction of device's conductive channel is smaller than a dimension of a lower surface of the second well region in the width direction of device's conductive channel.

In an embodiment, forming the drift region on the upper surface of the substrate, where the drift region includes the at least two first well regions with the second conductivity type and the at least one second well region with the first conductivity type that contact each other and are alternately arranged along the width direction of the device's conductive channel includes:

forming a third well region with the second conductivity type on the upper surface of the substrate; and performing doping of the first conductivity type in the third well region to form the second well region, where the third well region in which the doping of ions of the first conductive type is not performed is the at least two first well regions.

In an embodiment, performing the doping of the first conductivity type in the third well region to form the second well region, where the third well region in which the doping of ions of the first conductive type is not performed is the at least two first well region includes:

performing a first implantation of ions of the first conductivity type to form a first ion implanted region, where the first ion implanted region is formed within the third well region and extends from an upper surface of the third well region to an interior of the third well region;

performing a second implantation of ions of the first conductivity type to form a second ion implanted region, where the second ion implanted region is formed within the third well region and located under the first ion implanted region, and an orthographic projection area of the second ion implanted region on the substrate is greater than an orthographic projection area of the first ion implanted region on the substrate; and performing heat treatment to expand the first ion implanted region into a first doped region and the second ion implanted region into a second doped region that is adjacent to and in contact with the first doped region, where a lower surface of the second doped region is coplanar with a lower surface of the third well region, the first doped region and the second doped region are combined to form the second well region, and the third well region in which the doping of ions of the first conductive type is not performed is the at least two first well regions.

In an embodiment, performing the first implantation of ions of the first conductivity type to form the first ion implanted region includes:

forming a mask layer with a first opening on a surface of the substrate, where the first opening exposes a portion of the upper surface of the third well region; and performing the first implantation of ions of the first conductivity type to form the first ion implanted region extending from the upper surface of the third well region to the interior of the third well region; and/or performing the second implantation of ions of the first conductivity type to form the second ion implanted region includes:

forming a mask layer with a second opening on a surface of the substrate, where the second opening exposes an upper surface of the first ion implanted region and a portion of the upper surface of the third well region around the first ion implanted region; performing the second implantation of ions of the first conductivity type to form the second ion implanted region located within the third well region and under the first ion implanted region.

In an embodiment, in a case where the mask layer with the first opening is formed on the surface of the substrate, forming the mask layer with the second opening on the surface of the substrate includes:

etching back the mask layer with the first opening to expand the first opening to expose a portion of the upper surface of the third well region around the first ion implanted region, to obtain the mask layer with the second opening on the surface of the substrate.

In an embodiment, ion implantation energy for performing the first implantation is lower than ion implantation energy for performing the second implantation.

In an embodiment, an ion implantation dosage for performing the first implantation is higher than an ion implantation dosage for performing the second implantation.

The above semiconductor device increases the breakdown voltage of the device by inserting the second well region between the first well regions, and at the same time, the dimension of the upper surface of the second well region in the width direction of the device's conductive channel is set to be smaller than the dimension of the lower surface of the second well region in the width direction of the device's conductive channel to increase the dimension of the upper surface of the adjacent first well region in the width direction of the device's conductive channel. That is, the path width of the current flowing through the upper surface of the drift region is increased when the device is on, and thus the device's on-resistance is reduced. Finally, the on-resistance of the device is effectively reduced while the breakdown voltage of the device is improved.

BRIEF DESCRIPTION OF DRAWINGS

In order to provide a clearer explanation of the embodiments of the present disclosure or technical solutions in traditional technologies, the drawings needed in the description of the embodiments or the traditional technology are briefly introduced below. The drawings in the following description are only some embodiments of the present disclosure. Those of ordinary skill in the art can also obtain other drawings based on these drawings without exerting creative efforts.

DETAILED DESCRIPTION

Figure 1:
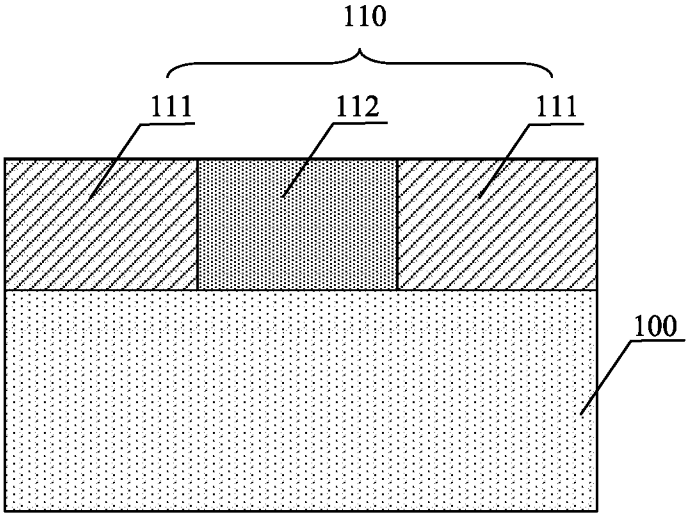
FIG. 1 is a structural schematic diagram of a semiconductor device according to an embodiment.

In order to facilitate the understanding of the present disclosure, a more comprehensive description is provided below with reference to the relevant drawings. The drawings provide embodiments of the present disclosure. However, the present disclosure can be implemented in many different forms, and is not limited to the embodiments described herein. On the contrary, the purpose of providing these embodiments is to make the content of the present disclosure more thorough and comprehensive.

It should be understood that when a component or layer is referred to as "on", "adjacent to", "connected to" or "coupled to" other components or layers, it can be directly on, adjacent to, connected to, or coupled to other components or layers, or there can be intervening components or layers. On the contrary, when a component is referred to as "directly on", "directly adjacent to", "directly connected to", or "directly coupled to" other components or layers, there is no intervening component or layer. It should be understood that although the terms first, second, third, etc, may be used to describe various components, parts, regions, layers, doping types and/or portions, these components, parts, regions, layers, doping types and/or portions should not be limited by these terms. These terms are only used to distinguish one component, part, region, layer, doping type or portion from another component, part, region, layer, doping type or portion. Therefore, without departing from the teachings of the present disclosure, a first component, part, region, layer, doping type or portion discussed below can be represented as a second component, part, region, layer or portion. For example, a first doping type can be designated as a second doping type, and similarly, the second doping type can be designated as the first doping type, where the first doping type and the second doping type are different doping types. For example, the first doping type can be P-type and the second doping type can be N-type, or the first doping type can be N-type and the second doping type can be P-type.

Spatial relationship terms such as "below", "under", "lower", "at a bottom of", "at a top of", "upper", etc, can be used here to describe the relationship between a component or a feature and other components or features in a drawing. It should be understood that in addition to the orientation shown in the drawings, spatial relationship terms further include different orientations of devices in use and operation. For example, if a device in a drawing is flipped, a component or feature described as "below", "under" or "beneath" other components or features would then be oriented "on" the other components or features. Therefore, exemplary terms "below" and "under" may include both upward and downward orientations. In addition, the device can further include additional orientations (such as rotation of 90 degrees or other orientations), and the spatial descriptors used here are explained accordingly.

When used here, singular forms of "a", "one", and "the/this" can also include plural forms, unless the context clearly indicates another way. It should be understood that the terms "include/include" or "have" specify the existence of the stated features, entirety, step, operation, component, part or their combination, but do not exclude the possibility of the existence or addition of one or more other features, entireties, steps, operations, components, parts or their combination. Meanwhile, in the present disclosure, the term "and/or" includes any and all combinations of related listed items.

Embodiments of the present disclosure are described herein with reference to cross-section diagrams of the schematic illustrations of preferred embodiments (and intermediate structures) of the present disclosure. As such, variations from the shapes as shown due to, for example, manufacturing techniques and/or tolerances can be anticipated. Therefore, embodiments of the present disclosure should not be limited to specific shapes of the regions as shown, but rather include shape deviations caused by, for example, manufacturing. For example, an implantation region illustrated as rectangles typically have circular or curved features at its edges and/or an implantation concentration gradient, while it is not a binary change from an implantation region to a non-implantation region. Similarly, a buried region formed by implantation can lead to some implantation in regions between the buried region and a surface through which the injectant passes during implantation. Therefore, the regions shown in the drawings are essentially schematic, and their shapes are not intended to illustrate an actual shape of a region of a device and is not intended to limit the scope of the present disclosure.

The inventor's research found that in order to increase the breakdown voltage and simultaneously reduce the on-resistance, in existing high-voltage devices, the ion concentration in the drift region is usually increased. At the same time, in order to ensure the high breakdown voltage of the device, ion implantation regions with the opposite conductivity type to the drift region will be repeatedly inserted into the drift region to enhance the depletion of the drift region, and ultimately achieve an increase in the breakdown voltage of the device while reducing the on-resistance of the device.

However, since the current flows through the surface of the drift region when the device is turned on, inserting an implantation region opposite to the conductivity type in the drift region will reduce the proportion of the drift region and narrow the current path. Therefore, low enough on-resistance cannot be obtained.

FIG. 1 is a cross-sectional structural schematic diagram of an exemplary semiconductor device. As shown in FIG. 1, the semiconductor device includes a P-type substrate 100 and a drift region 110, where the drift region 110 includes N-type well regions 111 and P-type well regions 112, and the N-type well regions 111 and the P-type well regions 112 are alternately arranged. The P-type well region 112 and the N-type well region 111 are both cuboid structures, and the P-type well regions 112 are respectively located between the N-type well regions 111. The inventor's research found that although this structure enhances the overall depletion of the drift region 110 and improves the breakdown voltage of the device, it sacrifices the proportion of the N-type well regions 111 in the drift region 110, which makes the current path narrower when the device is on and difficult to reduce the device's on-resistance. If the on-resistance of the device is to be reduced, the proportion of the N-type well region 111 needs to be increased, but this cannot effectively enhance the overall depletion of the drift region, and thus cannot increase the breakdown voltage of the device. Therefore, the exemplary semiconductor device shown in FIG. 1 still cannot effectively overcome the contradiction between increasing the breakdown voltage of the device and reducing the device's on-resistance.

Figure 2:
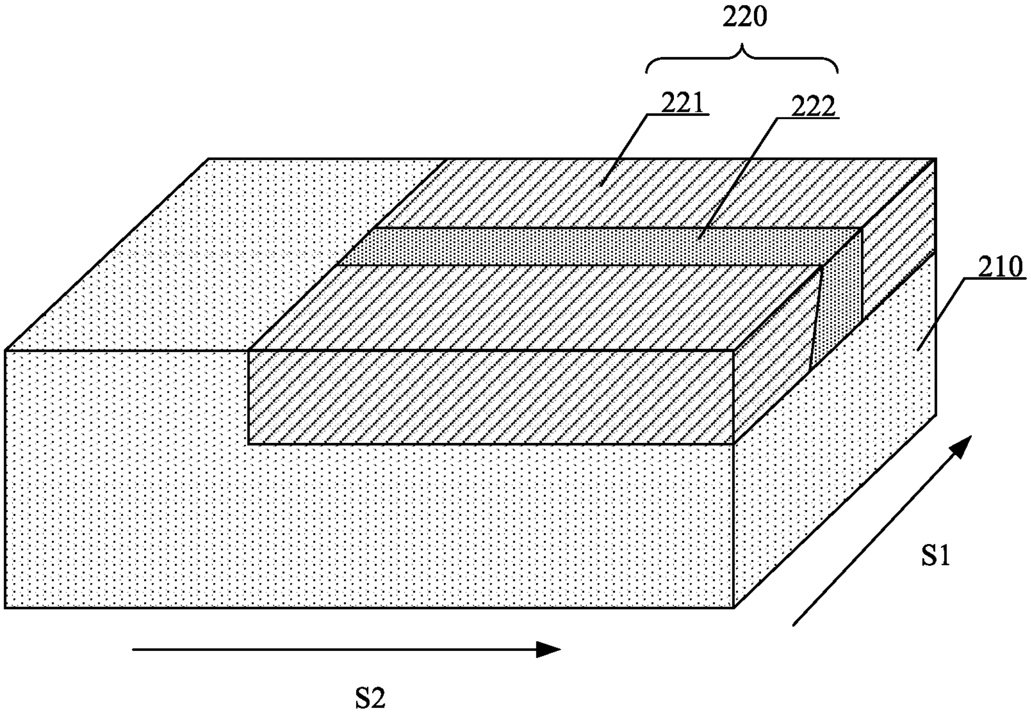
FIG. 2 is a structural schematic diagram of a semiconductor device according to an embodiment.

FIG. 2 is a structural schematic diagram of a semiconductor device in an embodiment. As shown in FIG. 2, the semiconductor device includes a substrate 210 and a drift region 220. The substrate 210 has a first conductivity type.

The drift region 220 is located on an upper surface of the substrate 210, and the drift region 220 includes at least two first well regions 221 each with a second conductivity type and at least one second well region 222 each with a first conductivity type, where the at least two first well regions 221 and the at least one second well region 222 are alternately arranged along a width direction of the device's conductive channel and. The first conductivity type and the second conductivity type have opposite conductivity types. The dimension of the upper surface of the at least one second well region 222 in the width direction of device's conductive channel is smaller than the dimension of the lower surface of the at least one second well region 222 in the width direction of device's conductive channel.

The width direction of the device's conductive channel is parallel to the surface of the substrate 210 and perpendicular to the length direction of the device's conductive channel, where the length direction of the device's conductive channel is the direction of the device's source electrode pointing towards the drain electrode. As shown in FIG. 2, the width direction of the device's conductive channel can be represented by S1, and the length direction of the device's conductive channel can be represented by direction S2.

It can be understood that when the device is turned on, most of the carriers move within the device's conductive channel composed of the source region, drift region 220, and drain region. The majority of the carriers flowing between the source region and drift region 220 will move in the upper part of the first well region 221 within the drift region 220. The second well region 222 between two first well regions 221 can enhance the depletion of the drift region 220, thereby increasing the breakdown voltage of the device. In this embodiment, the second well region 222 is manufactured: in the width direction of the device's conductive channel, the dimension of its upper surface is reduced to less than the dimension of its lower surface. When the dimension of the upper surface of the drift region 220 is fixed, that is, when the sum of the dimensions of the upper surfaces of the first well region 221 and the second well regions 222 is fixed, the dimension of the upper surface of the first well region 221 will increase, thereby increasing the path width of the current flowing through the drift region 220 and reducing the overall on-resistance of the device. Ultimately, it can not only increase the breakdown voltage of the device, but also reduce the on-resistance of the device.

Figure 7:
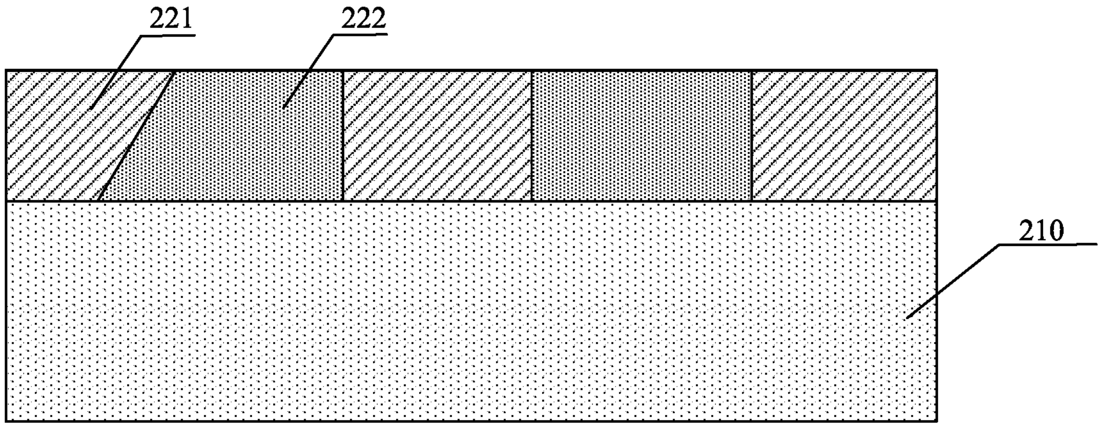
FIG. 7 is a cross-sectional structural schematic diagram of a semiconductor device along a width direction of a device's conductive channel according to another embodiment.
Figure 8:
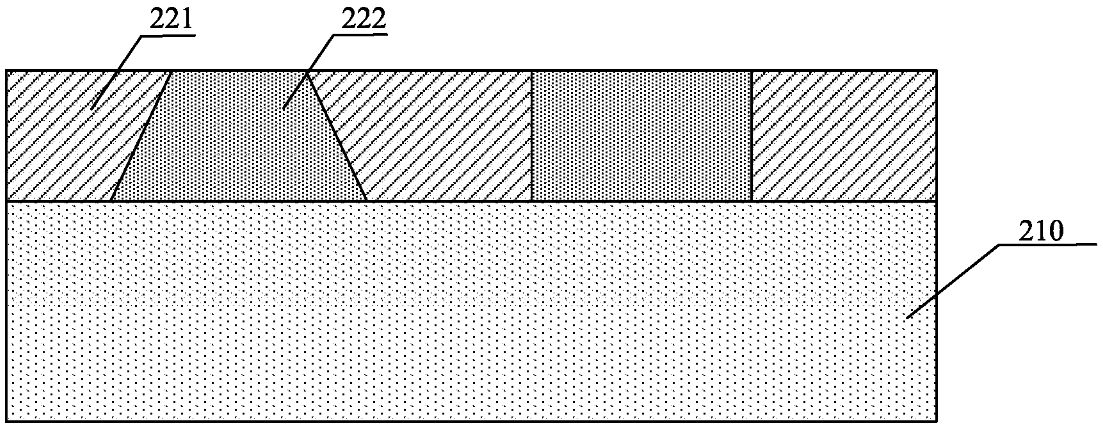
FIG. 8 is a cross-sectional structural schematic diagram of a semiconductor device along a width direction of a device's conductive channel according to another embodiment.
Figure 9:
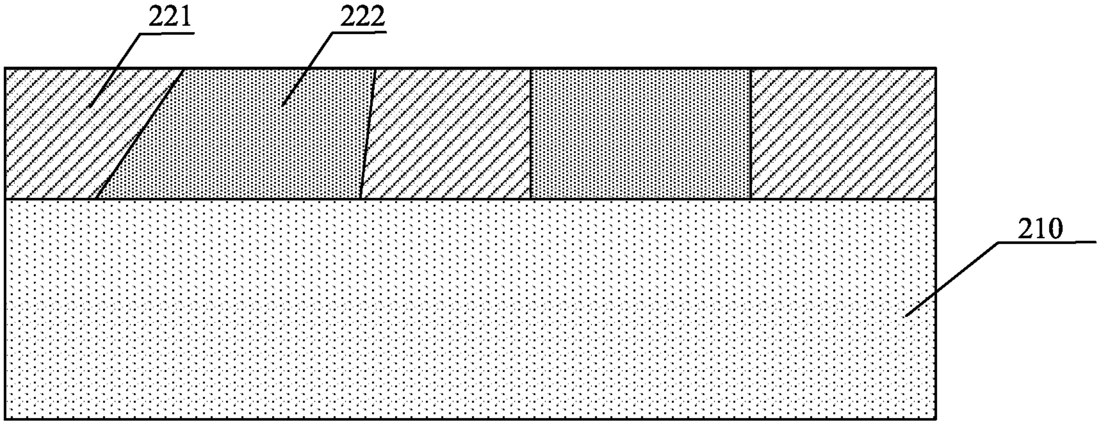
FIG. 9 is a cross-sectional structural schematic diagram of a semiconductor device along a width direction of a device's conductive channel according to another embodiment.

The number of the first well regions 221 and the number of the second well regions 222 can be multiple, and each second well region 222 is located between two first well regions 221 (refer to FIGS. 7 to 9). A dimension of an upper surface of at least one second well region 222 in the width direction of device's conductive channel is smaller than a dimension of a lower surface of the at least one second well region 222 in the width direction of device's conductive channel. For example, the number of the first well regions 221 is 3, and the number of the second well regions 222 is 2. In one embodiment, a dimension of an upper surface of one second well region 222 in the width direction of device's conductive channel is smaller than a dimension of a lower surface of the second well region 222 in the width direction of device's conductive channel. Alternately, dimensions of upper surfaces of two second well regions 222 in the width direction of device's conductive channel are smaller than dimensions of lower surfaces of the two second well regions 222 in the width direction of device's conductive channel. It can be understood that setting multiple first well regions 221 and multiple second well regions 222 to be alternately arranged can achieve a more ideal depletion state of the drift region 220, improving the breakdown voltage of the device while also reducing the on-resistance.

In this embodiment, the semiconductor device increases the breakdown voltage of the device by inserting the second well region 222 between the first well regions 221, and at the same time, the dimension of the upper surface of the second well region 222 in the width direction of the device's conductive channel is set to be smaller than the dimension of the lower surface of the second well region 222 in the width direction of the device's conductive channel to increase the dimension of the upper surface of the adjacent first well region 221 in the width direction of the device's conductive channel, that is, the path width of the current flowing through the upper surface of the drift region 220 is increased when the device is on, and thus the device's on-resistance is reduced. Finally, the on-resistance of the device is effectively reduced while the breakdown voltage of the device is increased.

In an embodiment, a doping concentration on the upper surface of the second well region 222 is greater than a doping concentration on the lower surface of the second well region 222.

It can be understood that the second well region 222 has different doping concentration, and the doping concentration on the upper surface is greater than the doping concentration on the lower surface, which can enhance the depletion of the drift region 220 and thereby increase the breakdown voltage. The second well region 222 can use the same type of doping ions.

In an embodiment, upper surfaces of the first well regions 221, the upper surface of the second well region 222, and an upper surface of the substrate 210 are coplanar, lower surfaces of the first well regions 221 and the lower surface of the second well region 222 are coplanar, and thicknesses of the first well regions 221 are equal to a thickness of the second well region 222.

Figure 3:
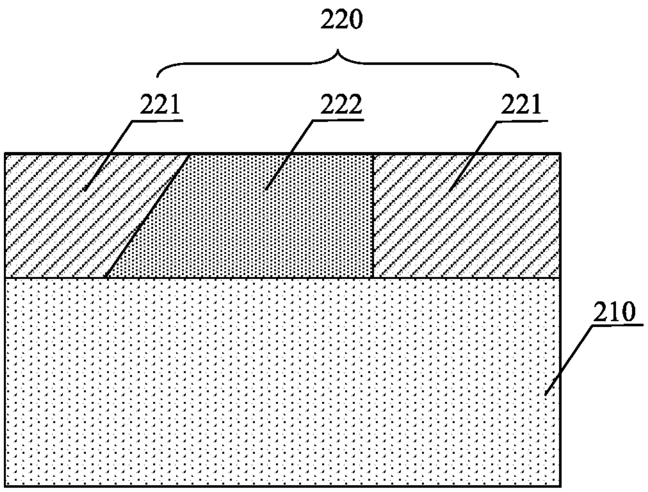
FIG. 3 is a cross-sectional structural schematic diagram of a semiconductor device along a width direction of a device's conductive channel according to an embodiment.
Figure 4:
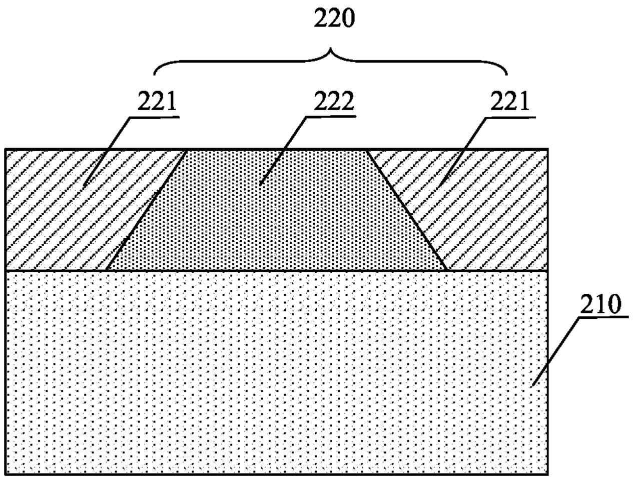
FIG. 4 is a cross-sectional structural schematic diagram of a semiconductor device along a width direction of a device's conductive channel according to another embodiment.
Figure 5:
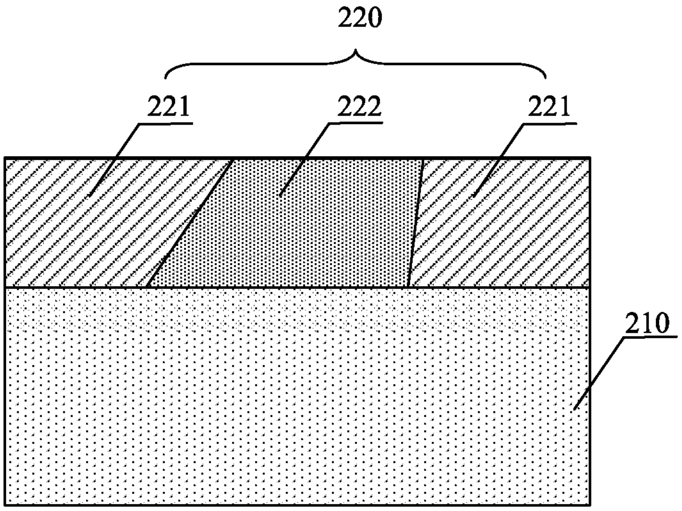
FIG. 5 is a cross-sectional structural schematic diagram of a semiconductor device along a width direction of a device's conductive channel according to another embodiment.

Referring to FIGS. 3 to 5, it can be understood that the thicknesses of the first well region 221 and the second well region 222 are the same, and the upper surfaces and the lower surfaces of the first well region 221 and the second well region 222 are respectively coplanar. The upper surfaces of the first well region 221 and the second well region 222 are also the upper surface of the substrate 210. Therefore, when the device is on, most carriers can flow on the upper surface of the substrate 210, ensuring that there is a sufficiently wide current path on the upper surface while also reducing the on-resistance. The thickness of the first well region 221 and the thickness of the second well region 222 are respectively the dimensions of the first well region 221 and the second well region 222 in the direction of the lower surface of the substrate 210 pointing towards the upper surface of the substrate 210.

In an embodiment, the second well region 222 includes a first doped region and a second doped region under the first doped region, and a doping concentration of the first doped region is greater than a doping concentration of the second doped region.

Figure 6:
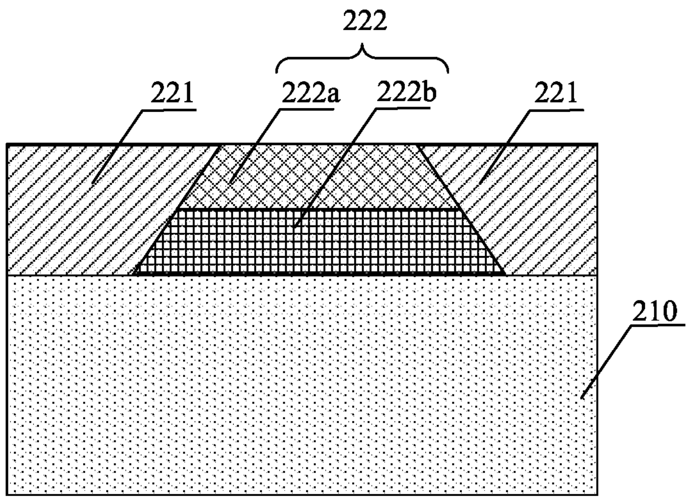
FIG. 6 is a cross-sectional structural schematic diagram of a semiconductor device along a width direction of a device's conductive channel according to another embodiment.

Taking the cross-sectional view of the semiconductor device in the embodiment of FIG. 4 as an example, the second well region 222 includes a first doped region and a second doped region under the first doped region, as shown in FIG. 6. The first doped region 222*a* is located on the upper surface of the drift region 220, and the second doped region 222*b* is located under the first doped region 222*a* and in contact with the lower surface of the first doped region 222*a*. The doping concentration of the first doped region 222*a* is greater than the doping concentration of the second doped region 222*b*, which can enhance the depletion of the drift region 220 and thereby increase the breakdown voltage. It can be understood that the first doped region 222*a* and the second doped region 222*b* are doped with the same type of ions, which have the same conductivity type.

In an embodiment, at least one of interfaces between the first well regions 221 and the second well region 222 is inclined to a plane of the substrate 210.

It can be understood that during the manufacturing process, at least one of interfaces between the first well regions 221 and the second well region 222 is inclined to a plane of the substrate 210, which can achieve that the dimension of the upper surface of a second well region 222 in the width direction of the device's conductive channel is smaller than the dimension of the lower surface of the second well region 222. Compared to existing semiconductor devices, where the interface between two well regions is planar and perpendicular to the plane of the substrate 210, in this embodiment, the area of the inclined interface is larger, making the depletion of the second well region 222 more sufficient for the first well region 221, further strengthening the depletion of the drift region 220, improving the breakdown voltage of the device, while ensuring a sufficiently wide current path on the upper surface to reduce the on-resistance.

Taking the number of the first well regions 221 as 2 and the number of the second well regions 222 as 1 as an example, the cross-sectional diagram of the first well regions 221 and the second well region 222 along the width direction of the device's conductive channel can be referred to FIGS. 3 to 5. When only one interface in the interfaces between the first well regions 221 and the second well region 222 is inclined to the plane of the substrate 210, the cross-sectional shape of one of the first well regions 221 and the cross-sectional shape of the second well region 222 can be right angled trapezoids, as shown in FIG. 3. In an embodiment, when both interfaces are inclined to the plane of the substrate 210, the two first well regions 221 can both be right angled trapezoids, while the second well region 222 is non right angled trapezoids, that is, the cross-sectional shapes of the first well region 221 and the second well region 222 along the width direction of the device's conductive channel are trapezoidal, as shown in FIG. 4. Alternatively, the two first well regions 221 are both right angled trapezoids, while the second well region 222 has an irregular pattern, as shown in FIG. 5. It can be understood that only the cross-sectional shapes of the first well region 221 and the second well region 222 in the width direction of the device conductive channel are shown by example here. In fact, in a case of the size of the upper surface of the second well region 222 is smaller than the size of the lower surface of the second well region 222, there may be other shapes, and examples will not be provided here.

When there are multiple first well regions 221 and second well regions 222, taking the number of the first well regions 221 as 3 and the number of the second well regions 222 as 2 as an example, in a case where only one upper surface of second well region 222 has a smaller size in the width direction of the device's conductive channel than the lower surface of second well region 222 in the width direction of the device's conductive channel, in an embodiment, if only one interface is inclined to the plane of the substrate 210, the cross-sectional structure of each well region is shown in FIG. 7, and in an embodiment, when two interfaces are inclined to the plane of the substrate 210, there are two first well regions 221 that are both right angled trapezoids, as shown in FIGS. 8 to 9. In a case where the dimensions of the upper surfaces of two second well regions 222 in the width direction of the device's conductive channel are both smaller than the dimensions of the lower surfaces of two second well regions 222 in the width direction of the device's conductive channel, the cross-sectional shapes of the two second well regions 222 can refer to the cross-sectional shapes of the second well region 222 in embodiments of FIGS. 3 to 5, where the cross-sectional shapes of the two second well regions 222 can be the same or different. In an embodiment, the cross-sectional shapes of the first well region 221 and the second well region 222 along the width direction of the device conductive channel are both trapezoidal, for example, they can both be trapezoidal as shown in FIG. 4. In this case, the dimension difference between the upper and lower surfaces of the second well region 222 in the width direction of the device conductive channel, and the interface area between the first well region 221 and the second well region 222, are both large, making the depletion of the second well region 222 for the first well region 221 more sufficient, further strengthening the depletion of drift region 220 and increasing the breakdown voltage of the device, which can maximize the width of the current path on the upper surface, effectively reducing the on-resistance.

In an embodiment, the interface between the first well region 221 and the second well region 222 may also be curved. It can be understood that when the interface is a curved surface, in the direction perpendicular to the width of the device's conductive channel, such as in the direction of the lower surface of the drift region 220 pointing towards the upper surface, the second well region 222 may have a gradient dimension (such as when the curved surface is concave or convex) or a non-gradient dimension (such as when the curved surface is wave).

In an embodiment, the first conductivity type or the second conductivity type can be either P-type or N-type, where the first conductivity type and the second conductivity type are opposite.

Figure 10:
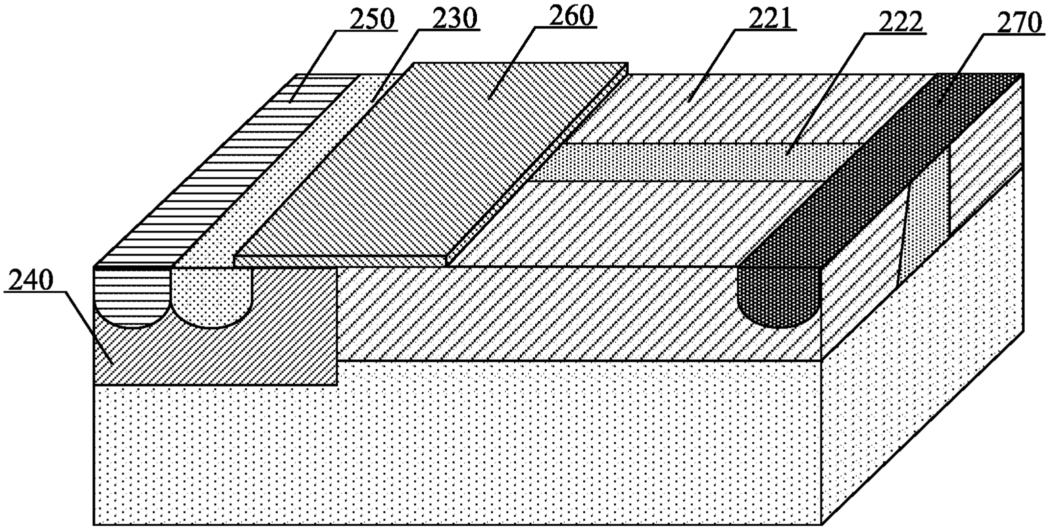
FIG. 10 is a structural schematic diagram of a semiconductor device according to another embodiment.

In an embodiment, the semiconductor device may further include a source region 230, a body region 240, a body lead-out region 250, a gate electrode 260, and a drain region 270. Taking the semiconductor device of the embodiment in FIG. 2 as an example, as shown in FIG. 10, the source region 230 is located on the upper surface of the substrate 210 and separated from the drift region 220, and has a second conductivity type. The body region 240 surrounds the source region 230) and is adjacent to or spaced apart from the drift region 220. The body lead-out region 250 is located on the upper surface of the body region 240 and adjacent to the source region 230. The body lead-out region 250 has a first conductivity type. The gate electrode 260) is located on the surface of the substrate 210 and extends to cover the drift region 220), body region 240, and source region 230. The drain region 270 is located on the upper surface of the drift region 220 and is separated from the gate electrode 260.

It can be understood that setting the body region 240 adjacent to the drift region 220 may slightly reduce the breakdown voltage of the device, but it can also reduce the on-resistance of the device, reduce the size of the device, and optimize the volume of the device. The position distribution when the body region 240 is adjacent to the drift region 220 is shown in FIG. 10. Setting the body region 240 and drift region 220 apart may slightly increase the on-resistance of the device but fail to optimize the device volume, but it can increase the breakdown voltage of the device. In an embodiment, the body region 240 and the drift region 220 can be set adjacent to each other.

In an embodiment, the body region 240 may have a first conductivity type.

In an embodiment, the drain region 270 may have a second conductivity type, and in an embodiment, the drain region 270) may have an N-type conductivity type.

In an embodiment, the doping depth of the body region 240 is greater than the doping depth of the drift region 220, which can enhance the depletion of the drift region 220 and achieve higher breakdown voltage.

Figure 11:
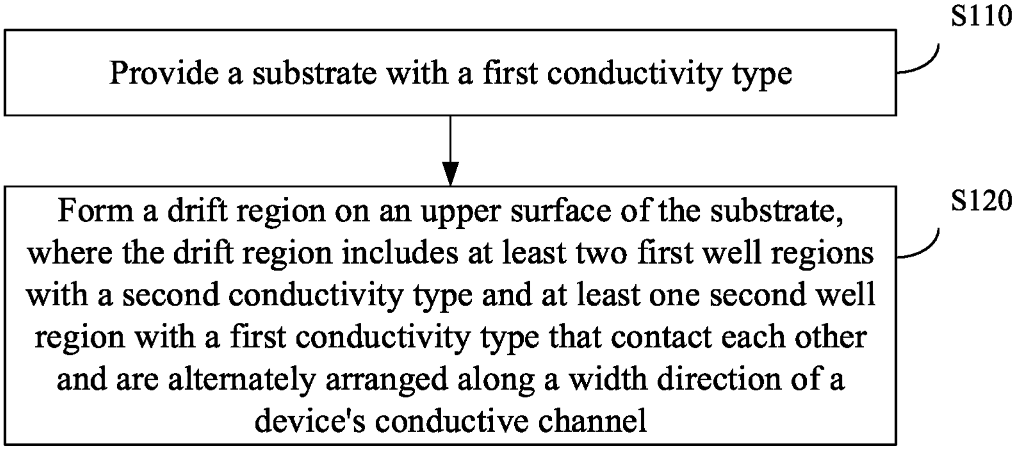
FIG. 11 is a flowchart of a manufacturing method of semiconductor device according to an embodiment.

This embodiment further provides a manufacturing method of a semiconductor device, as shown in FIG. 11, which includes steps S110 to S120.

In step S110, a substrate with a first conductivity type is provided.

In step S120, a drift region is formed on an upper surface of the substrate, where the drift region includes at least two first well regions with a second conductivity type and at least one second well region with a first conductivity type that contact each other and are alternately arranged along a width direction of a device's conductive channel, where the first conductivity type and the second conductivity type have opposite conductivity types, and for one of the at least one second well region, a dimension of an upper surface of the second well region in the width direction of device's conductive channel is smaller than a dimension of a lower surface of the second well region in the width direction of device's conductive channel.

The drift region can be formed on the upper surface of the substrate through ion implantation technology. In an embodiment, the first conductivity type or the second conductivity type can be either P-type or N-type.

The specific structures of the first and second well regions within the drift region have been elaborated in the embodiment of FIG. 2, and will not be elaborated here.

In the embodiments of the present disclosure, by manufacturing at least two first well regions with a second conductivity type and at least one second well region with a first conductivity type arranged alternately and adjacent to each other along the width direction of the device's conductive channel, the breakdown voltage of the device is increased, and at the same time, the dimension of the upper surface of the second well region in the width direction of the device's conductive channel is set to be smaller than the dimension of the lower surface of the second well region in the width direction of the device's conductive channel to increase the dimension of the upper surface of the adjacent first well region in the width direction of the device's conductive channel. That is, the path width of the current flowing through the upper surface of the drift region is increased when the device is on, and thus the device's on-resistance is reduced. Finally, the on-resistance of the device is effectively reduced while the breakdown voltage of the device is improved.

In an embodiment, forming the drift region on the upper surface of the substrate, where the drift region includes the at least two first well regions with the second conductivity type and the at least one second well region with the first conductivity type that contact each other and are alternately arranged along the width direction of the device's conductive channel includes: forming a third well region with the second conductivity type on the upper surface of the substrate; and performing doping of the first conductivity type in the third well region to form the second well region, where the third well region in which the doping of ions of the first conductive type is not performed is used as the at least two first well regions.

A second-conductivity-type impurity can be implanted into the upper surface of the substrate to form a third well region on the upper surface of the substrate, and then a first-conductivity-type impurity can be implanted into the third well region to form a second well region. The first-conductivity-type impurity can be implanted into the middle of the two edges of the third well region along the width direction of the device's conductive channel, and a part of the third well region where the first-conductivity-type impurity is not doped and only the second-conductivity-type impurity is doped serves as the first well regions. The first well regions and the second well region jointly form the drift region, where the number of first well regions can include multiple, and each first well region can have the same shape and size as each other, or at least one first well region has a different shape and size from other first well regions.

It can be understood that the third well region with the second conductivity type is first formed in the substrate, and then the first-conductivity-type doping is directly performed in the third well region to form the second well region with the first conductivity type, and the remaining third well region without the first-conductivity-type doping serves as the first well region. The method is simple and easy to implement.

In an embodiment, performing the doping of the first conductivity type in the third well region to form the second well region, where the third well region in which the doping of ions of the first conductive type is not performed is the at least two first well region includes: performing a first implantation of ions of the first conductivity type to form a first ion implanted region, where the first ion implanted region is formed within the third well region and extends from an upper surface of the third well region to an interior of the third well region;

performing a second implantation of ions of the first conductivity type to form a second ion implanted region, where the second ion implanted region is formed within the third well region and located under the first ion implanted region, and an orthographic projection area of the second ion implanted region on the substrate is greater than an orthographic projection area of the first ion implanted region on the substrate; and performing heat treatment to expand the first ion implanted region into a first doped region and the second ion implanted region into a second doped region that is adjacent to and in contact with the first doped region, where a lower surface of the second doped region is coplanar with a lower surface of the third well region, the first doped region and the second doped region are combined to form the second well region, and the third well region in which the doping of ions of the first conductive type is not performed is the at least two first well regions.

Figure 12:
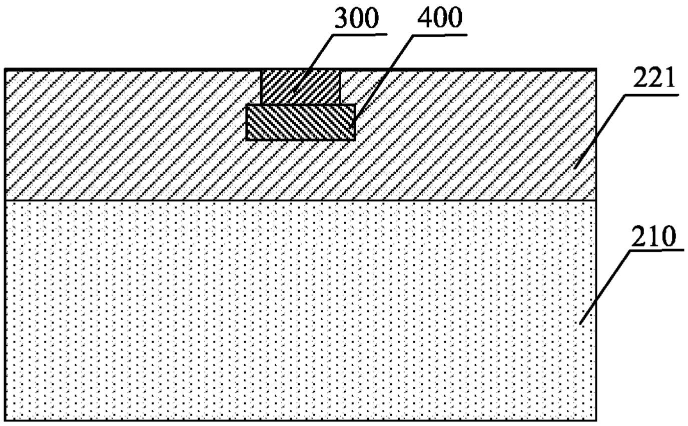
FIG. 12 is a cross-sectional structural schematic diagram of a semiconductor device along a width direction of a device's conductive channel according to another embodiment.
Figure 14:
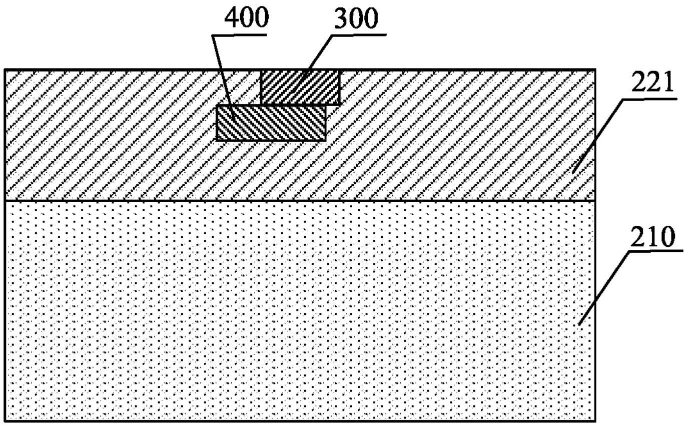
FIG. 14 is a cross-sectional structural schematic diagram of another semiconductor device along a width direction of a device's conductive channel according to an embodiment.

Referring to FIGS. 6, 12, and 14, when the second well region is formed, the first-conductivity-type ions are first implanted into a region from the upper surface of the third well region to interior of the third well region extending to form the first ion implanted region 300. Then, the first-conductivity-type ion is implanted again into a region under the first ion implanted region in the third well region to form the second ion implanted region 400. The positional relationship between the first ion implanted region 300 and the second ion implanted region 400 can be seen in FIG. 12. Then, heat treatment is performed to perform high-temperature well-drive-in of the first ion implanted region 300 and the second ion implanted region 400 at a predetermined temperature, causing the first implantation region 300 to expand into the first doped region 222*a* (as shown in FIG. 6)

and the second ion implanted region 400 to expand into the second doped region 222*b*. The first doped region 222*a* and the second doped region 222*b* are adjacent and in contact, and the lower surface of the second doped region is coplanar with the lower surface of the third well region. Thus, the second well region formed by the combination of the first doped region and the second doped region is obtained. Since the forward projection area of the second ion implanted region on the substrate is greater than the forward projection area of the first ion implanted region on the substrate, after heat treatment, the dimension of the second doped region 222*b* in the width direction of device's conductive channel will be greater than the dimension of the first doped region 222*a* in the width direction of device's conductive channel, thereby increasing the path width of current flowing through the drift region, improving device breakdown voltage, and reducing on-resistance. It can be understood that the third well region is formed first, and then the third well region is processed to obtain the first well regions 221 and the second well region 222, and the first well regions 221 and the second well region 222 form the drift region 220.

Figure 13:
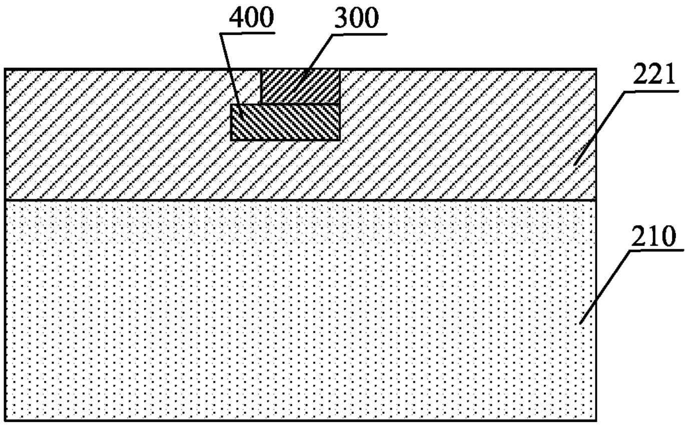
FIG. 13 is a cross-sectional structural schematic diagram of a semiconductor device along a width direction of a device's conductive channel according to another embodiment.

It can be understood that FIG. 12 only exemplify the positional relationship between the first ion implanted region 300 and the second ion implanted region 400. In this embodiment, the forward projection of the second ion implanted region 400 on the substrate 200 completely covers the forward projection of the first ion implanted region 300 on the substrate 200. In fact, in some embodiments, the forward projection of the second ion implanted region 400 on the substrate 200 can also partially cover the forward projection of the first ion implanted region 300 on the substrate 200, as shown in FIG. 13 or FIG. 14. In other embodiments, the forward projection of the second ion implanted region 400 on the substrate 200 may not cover the forward projection of the first ion implanted region 300 on the substrate 200, but the distance between the two ion implanted regions in the width direction of the device's conductive channel should be set such that, after the well-drive-in process is performed on the first ion implanted region 300 and the second ion implanted region 400, the first doped region 222*a* formed by the expansion of the first ion implanted region 300 and the second doped region 222*b* formed by the expansion of the second ion implanted region 400 can be adjacent to each other to form the second well region 222.

The well-drive-in process can be carried out under high temperature conditions.

Figure 15:
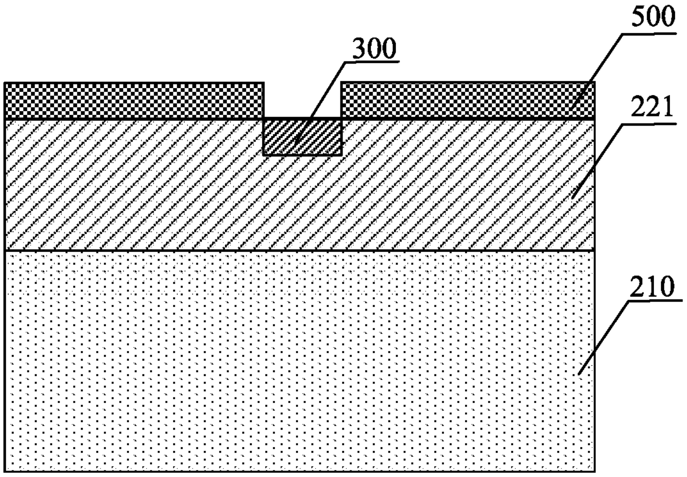
FIG. 15 is a cross-sectional structural schematic diagram of a semiconductor device along a width direction of a device's conductive channel according to another embodiment.

In an embodiment, as shown in FIG. 15, performing the first implantation of ions of the first conductivity type to form the first ion implanted region includes: forming a mask layer with a first opening on a surface of the substrate, where the first opening exposes a portion of the upper surface of the third well region; and performing the first implantation of ions of the first conductivity type to form the first ion implanted region extending from the upper surface of the third well region to the interior of the third well region.

It can be understood that by coating the mask layer 500 and etching a portion of the mask layer 500 to form a first opening, the first opening exposes the upper surface of the third well region, and then a first-conductivity-type ion implantation is performed on the upper surface of the exposed third well region, the formation of an ion implanted region with a specific region and size can be achieved to prevent contamination of other regions.

Figure 16:
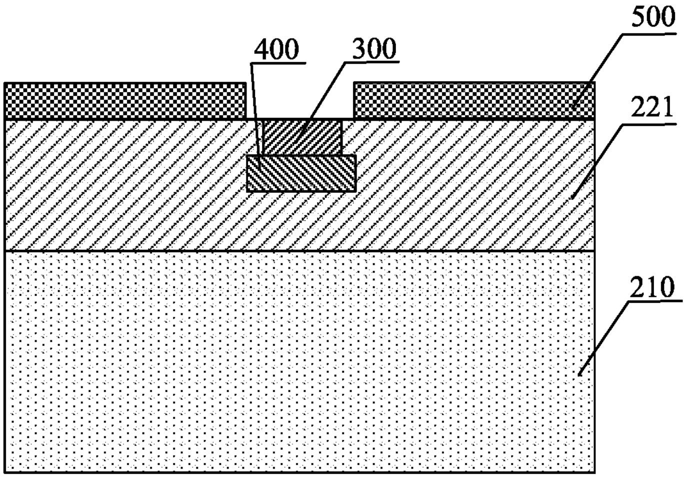
FIG. 16 is a cross-sectional structural schematic diagram of a semiconductor device along a width direction of a device's conductive channel according to another embodiment.

In an embodiment, as shown in FIG. 16, performing the second implantation of ions of the first conductivity type to form the second ion implanted region includes: forming a mask layer with a second opening on a surface of the substrate, where the second opening exposes an upper surface of the first ion implanted region and a portion of the upper surface of the third well region around the first ion implanted region; performing the second implantation of ions of the first conductivity type to form the second ion implanted region located within the third well region and under the first ion implanted region.

It can be understood that after the formation of the first ion implanted region, a mask layer with a second opening can be further formed on the substrate surface to expose the upper surface of the first ion implanted region and its surrounding third well region. Therefore, after performing the second first-conductivity-type ion implantation, the forward projection area of the second ion implanted region on the substrate can be greater than the forward projection area of the first ion implanted region on the substrate. After heat treatment, the dimension of the upper surface of the second well region in the width direction of the device's conductive channel is smaller than the dimension of the lower surface of the second well region in the width direction of the device's conductive channel. Therefore, it can increase the breakdown voltage while reducing the on-resistance.

In an embodiment, forming the mask layer with the second opening on the surface of the substrate includes: etching back the mask layer with the first opening to expand the first opening to expose a portion of the upper surface of the third well region around the first ion implanted region, to obtain the mask layer with the second opening on the surface of the substrate.

It can be understood that the mask layer 500 can be exposed to a small size area through photoresist, and then low energy ion implantation can be performed to form the first ion implanted region 300. After that, the mask layer 500 on the periphery of the first ion implanted region 300 can be further etched to expose the upper surface regions on both sides of the first ion implanted region 300, thereby expanding the exposed region of the drift region 220. Then ion implantation can be performed on the exposed region to form the second ion implanted region 400 where the forward projection area of the second ion implanted region 400 on the substrate is greater than the forward projection area of the first ion implanted region on the substrate. Subsequently, a second well region 222 can be manufactured through the well-drive-in process. The dimension of the upper surface of the second well region 222 in the width direction of the device's conductive channel is smaller than the dimension of the lower surface of the second well region 222 in the width direction of the device's conductive channel.

A part of the upper surface of the third well region around the first ion implanted region is etched back, then the ion implantation is continued to form the second ion implanted region 400, and heat treatment is performed. The final structure of the second well region 222 can be seen in FIG. 6.

The embodiment of this method only requires coating a mask layer once, and an alternating drift region structure is formed through two implantations without adding a mask layer. The method is simple and easy to implement, and the prepared semiconductor device not only ensures a sufficiently wide current path on the surface of the drift region, but also increases the interface between the first and second well regions in the drift region, and thus, the depletion of the second well region to the first well region is more sufficient, resulting in lower on-resistance.

In addition, when forming the second ion implanted region, wet etching can be used to expose the surface region.

In an embodiment, during secondary etching, only one side of the third well region around the first ion implanted region can be etched, so that the resulting second well region can have a rectangular trapezoidal cross-sectional shape in the width direction of the device's conductive channel.

In an embodiment, ion implantation energy for performing the first implantation is lower than ion implantation energy for performing the second implantation. In another embodiment, an ion implantation dosage for performing the first implantation is higher than an ion implantation dosage for performing the second implantation, such that after performing heat treatment to obtain the first and second doped regions, the doping concentration in the first doped region can be greater than the doping concentration in the second doped region.

The above embodiments only exemplify the manufacturing method of a semiconductor device when only two first well regions and one second well region are included. When the number of first well regions and the number of second well regions are multiple, the manufacturing method is similar to the above embodiments, and will not be repeated here.

In an embodiment, the manufacturing method further includes forming a body region on the surface of the substrate, where the body region is adjacent to or separated from the drift region; and then forming a gate electrode extending to cover the drift region and body region on the surface of the substrate; forming a source region within the body region, where the source region extends and contacts the lower surface of the gate electrode; forming a drain region, which is located on the upper surface of the drift region and is separated from the gate electrode; and finally forming a body lead-out region, where the body lead-out region is located on the upper surface of the body region and adjacent to the source region.

In an embodiment, the body region is manufactured with a doping concentration greater than the doping concentration of the second well region with the first conductivity type, thereby ensuring that the breakdown voltage of the device can be further increased.

In an embodiment, the body region is manufactured with a doping depth greater than the doping depth of the drift region.

It should be understood that although the various steps in the flowchart of FIG. 11 are displayed in sequence according to the arrows, these steps are not necessarily executed in sequence in the order indicated by the arrows. Unless otherwise specified herein, there is no strict order restriction on the execution of these steps, and these steps can be executed in other orders. Moreover, at least some of the steps in FIG. 11 may include multiple steps or stages. These steps or stages are not necessarily executed at the same time, but may be executed at different times. These steps or stages is not necessarily performed sequentially, but may be performed sequentially or alternately with other steps or at least a part of steps or stages in other steps.

In the description of the present disclosure, the reference terms "some embodiments", "other embodiments", "ideal embodiments", etc, refer to the specific features, structures, materials, or features described in conjunction with the embodiments or examples included in at least one embodiment or example of the present disclosure. In the disclosure, the schematic description of the above terms may not necessarily refer to the same embodiments or examples.

The above embodiments only express several implementation modes of the present disclosure, and the descriptions thereof are relatively specific and detailed, but should not be construed as limiting the scope of the present disclosure. It should be pointed out that those skilled in the art can make several modifications and improvements without departing from the concept of the present disclosure, and these all belong to the protection scope of the present disclosure. Therefore, the protection scope of the present disclosure should be based on the appended claims.

The invention claimed is:

1. A semiconductor device, comprising:

a substrate with a first conductive type; and a drift region on an upper surface of the substrate, wherein the drift region comprises at least two first well regions with a second conductivity type and at least one second well region with a first conductivity type, the at least two first well regions and the at least one second well region are alternately arranged along a width direction of a conductive channel of the semiconductor device and contact each other, the first conductivity type and the second conductivity type have opposite conductivity types, and for one of the at least one second well region, a dimension of an upper surface of the second well region in the width direction of the conductive channel of the semiconductor device is smaller than a dimension of a lower surface of the second well region in the width direction of the conductive channel of the semiconductor device.

2. The semiconductor device according to claim 1, wherein a doping concentration on the upper surface of the second well region is greater than a doping concentration on the lower surface of the second well region.

3. The semiconductor device according to claim 1, wherein upper surfaces of the at least two first well regions, the upper surface of the second well region, and the upper surface of the substrate are coplanar, lower surfaces of the at least two first well regions and the lower surface of the second well region are coplanar, and a thickness of each of the at least two first well regions is equal to a thickness of the second well region.

4. The semiconductor device according to claim 1, wherein the second well region comprises a first doped region and a second doped region under the first doped region, and a doping concentration of the first doped region is greater than a doping concentration of the second doped region.

5. The semiconductor device according to claim 1, wherein at least one of interfaces between the at least two first well regions and the second well region is inclined to a plane of the substrate.

6. The semiconductor device according to claim 5, wherein cross-sectional shapes of the at least two first well regions and the second well region along the width direction of the conductive channel of the semiconductor device are trapezoidal.

7. The semiconductor device according to claim 1, wherein the semiconductor device further comprises:

a source region with the second conductivity type, on the upper surface of the substrate, and separated from the drift region;

a body region surrounding the source region and adjacent to or separated from the drift region;

a body lead-out region with the first conductivity type, on an upper surface of the body region, and adjacent to the source region;

a gate electrode on the upper surface of the substrate and covering the drift region, the body region and the source region; and a drain region on an upper surface of the drift region and separated from the gate electrode.

8. The semiconductor device according to claim 7, wherein a doping concentration in the body region is greater than a doping concentration in the second well region with the first conductivity type.

9. A manufacturing method of the semiconductor device according to claim 1, comprising:

providing a substrate with a first conductivity type; and forming a drift region on an upper surface of the substrate, wherein the drift region comprises at least two first well regions with a second conductivity type and at least one second well region with the first conductivity type, the at least two first well regions and the at least one second well region are alternately arranged along a width direction of a conductive channel of the semiconductor device and contact each other, the first conductivity type and the second conductivity type have opposite conductivity types, and for one of the at least one second well region, a dimension of an upper surface of the second well region in the width direction of the conductive channel of the semiconductor device is smaller than a dimension of a lower surface of the second well region in the width direction of the conductive channel of the semiconductor device.

10. The manufacturing method according to claim 9, wherein forming the drift region on the upper surface of the substrate, wherein the drift region comprises the at least two first well regions with the second conductivity type and the at least one second well region with the first conductivity type, the at least two first well regions and the at least one second well region are alternately arranged along the width direction of the conductive channel of the semiconductor device and contact each other, comprises:

forming a third well region with the second conductivity type on the upper surface of the substrate; and performing doping of the first conductivity type in the third well region to form the second well region, wherein the third well region in which the doping of ions of the first conductive type is not performed is the at least two first well regions.

11. The manufacturing method according to claim 10, wherein performing the doping of the first conductivity type in the third well region to form the second well region, wherein the third well region in which the doping of ions of the first conductive type is not performed is the at least two first well region comprises:

performing a first implantation of ions of the first conductivity type to form a first ion implanted region, wherein the first ion implanted region is formed within the third well region and extends from an upper surface of the third well region to an interior of the third well region;

performing a second implantation of ions of the first conductivity type to form a second ion implanted region, wherein the second ion implanted region is formed within the third well region and located under the first ion implanted region, and an orthographic projection area of the second ion implanted region on the substrate is greater than an orthographic projection area of the first ion implanted region on the substrate; and performing heat treatment to expand the first ion implanted region into a first doped region and the second ion implanted region into a second doped region that is adjacent to and in contact with the first doped region, wherein a lower surface of the second doped region is coplanar with a lower surface of the third well region, the first doped region and the second doped region are combined to form the second well region, and the third well region in which the doping of ions of the first conductive type is not performed is the at least two first well regions.

12. The manufacturing method according to claim 11, wherein performing the first implantation of ions of the first conductivity type to form the first ion implanted region comprises:

forming a mask layer with a first opening on a surface of the substrate, wherein the first opening exposes a portion of the upper surface of the third well region; and performing the first implantation of ions of the first conductivity type to form the first ion implanted region extending from the upper surface of the third well region to the interior of the third well region; and/or performing the second implantation of ions of the first conductivity type to form the second ion implanted region comprises:

forming a mask layer with a second opening on a surface of the substrate, wherein the second opening exposes an upper surface of the first ion implanted region and the portion of the upper surface of the third well region around the first ion implanted region; performing the second implantation of ions of the first conductivity type to form the second ion implanted region located within the third well region and under the first ion implanted region.

13. The manufacturing method according to claim 12, wherein forming the mask layer with the second opening on the surface of the substrate comprises:

etching back the mask layer with the first opening to expand the first opening to expose the portion of the upper surface of the third well region around the first ion implanted region, to obtain the mask layer with the second opening on the surface of the substrate.

14. The manufacturing method according to claim 11, wherein ion implantation energy for performing the first implantation of ions of the first conductivity type is lower than ion implantation energy for performing the second implantation of ions of the first conductivity type.

15. The manufacturing method according to claim 11, wherein an ion implantation dosage for performing the first implantation of ions of the first conductivity type is higher than an ion implantation dosage for performing the second implantation of ions of the first conductivity type.

* * * * *